(12) United States Patent
Xu et al.

(10) Patent No.: US 7,920,401 B2
(45) Date of Patent: Apr. 5, 2011

(54) METHOD, APPARATUS AND SYSTEM, PROVIDING A ONE-TIME PROGRAMMABLE MEMORY DEVICE

(75) Inventors: Chen Xu, Boise, ID (US); Thomas W. Voshell, Boise, ID (US); Karl Holtzclaw, Boise, ID (US)

(73) Assignee: Aptina Imaging Corporation, George Town (KY)

( * ) Notice: Subject to any disclaimer, the term of this patent is extended or adjusted under 35 U.S.C. 154(b) by 0 days.

(21) Appl. No.: 12/545,892

(22) Filed: Aug. 24, 2009

(65) Prior Publication Data

US 2009/0316466 A1 Dec. 24, 2009

Related U.S. Application Data

(62) Division of application No. 11/600,202, filed on Nov. 16, 2006, now Pat. No. 7,593,248.

(51) Int. Cl.
*G11C 17/00* (2006.01)

(52) U.S. Cl. ............... 365/96; 365/185.05; 365/185.14; 365/185.18; 365/185.28

(58) Field of Classification Search .......... 365/96, 365/185.05, 185.14, 185.18, 185.28
See application file for complete search history.

(56) References Cited

U.S. PATENT DOCUMENTS

| | | | |
|---|---|---|---|
| 5,315,177 A * | 5/1994 | Zagar et al. ............ 326/44 |
| 5,331,196 A | 7/1994 | Lowrey | |
| 5,844,298 A * | 12/1998 | Smith et al. ............ 257/530 |
| 5,886,392 A | 3/1999 | Schuegraf | |
| RE36,952 E | 11/2000 | Zagar | |
| 6,188,092 B1 | 2/2001 | Hatano et al. | |
| 6,441,482 B1 | 8/2002 | Foster | |
| 6,526,366 B1 | 2/2003 | Dunton | |
| 6,529,239 B1 | 3/2003 | Dyck et al. | |
| 6,566,151 B2 | 5/2003 | Yeh et al. | |
| 6,587,142 B1 | 7/2003 | Kozlowski et al. | |
| 7,052,941 B2 | 5/2006 | Lee | |
| 7,173,851 B1 | 2/2007 | Callahan et al. ........ 365/185.05 |
| 7,236,415 B2 | 6/2007 | Forbes et al. ............ 365/207 |
| 7,365,298 B2 | 4/2008 | Ryu | |
| 7,369,167 B2 | 5/2008 | Bruce et al. | |
| 7,593,248 B2 | 9/2009 | Xu et al. | |
| 7,692,673 B2 * | 4/2010 | Shin ............... 345/694 |
| 2002/0079504 A1 | 6/2002 | Kim | |
| 2002/0154229 A1 | 10/2002 | Takahashi et al. | |
| 2003/0052976 A1 | 3/2003 | Harada et al. | |
| 2004/0084700 A1 | 5/2004 | Kim | |
| 2004/0239789 A1 | 12/2004 | Bruce et al. | |
| 2005/0007855 A1 * | 1/2005 | Lee et al. ............ 365/225.7 |
| 2005/0102576 A1 * | 5/2005 | Perner et al. ............ 714/36 |
| 2006/0007331 A1 | 1/2006 | Izumi et al. | |
| 2006/0145055 A1 | 7/2006 | Kim | |
| 2006/0183265 A1 | 8/2006 | Oh et al. | |
| 2007/0158772 A1 | 7/2007 | Boettiger | |
| 2008/0017945 A1 | 1/2008 | Wu et al. | |
| 2008/0054386 A1 | 3/2008 | Akram | |
| 2008/0116537 A1 | 5/2008 | Adkisson et al. | |
| 2008/0117319 A1 | 5/2008 | Jiang et al. | |
| 2008/0117661 A1 * | 5/2008 | Holtzclaw et al. ........ 365/96 |
| 2008/0122960 A1 | 5/2008 | Liu et al. | |

* cited by examiner

*Primary Examiner* — Connie C Yoha

(57) ABSTRACT

Disclosed are apparatus, system and methods of programming and readout of a one-time programmable memory device having an array of memory cells, where the cells include an anti-fuse element and an in-cell amplifier transistor. Circuitry configured for programming and correlated double sampling readout of the cells is also disclosed.

13 Claims, 11 Drawing Sheets

METHOD, APPARATUS AND SYSTEM, PROVIDING A ONE-TIME PROGRAMMABLE MEMORY DEVICE

CROSS-REFERENCE TO RELATED APPLICATIONS

This application is a divisional of U.S. patent application Ser. No. 11/600,202, filed Nov. 16, 2006 now U.S. Pat. No. 7,593,248, the entirety of which is incorporated herein by reference.

FIELD OF THE INVENTION

Disclosed embodiments relate to a method, apparatus and system providing a one-time programmable memory device.

BACKGROUND OF THE INVENTION

Memory can generally be characterized as either volatile or non-volatile. Volatile memory, for example, random access memory (RAM), requires constant power to maintain stored information. Non-volatile memory does not require power to maintain stored information. Various non-volatile memories include read only memories (ROMs), erasable programmable read only memories (EPROMs), and electrically erasable programmable read only memories (EEPROMs).

A one-time programmable memory device is a type of ROM that may be programmed one time and may not be reprogrammed. Some one time programmable memory devices use an anti-fuse as the programmable element. An anti-fuse may exist in one of two states. In its initial state, ("un-programmed") the anti-fuse functions as an open circuit, preventing conduction of current through the anti-fuse. Upon application of a high voltage or current, the anti-fuse is converted to a second state ("programmed") in which the anti-fuse functions as a line of connection permitting conduction of a current. During a readout of the device, an un-programmed anti-fuse corresponds to a logic value, for example "0", and a programmed anti-fuse represents another logic value, for example "1".

An anti-fuse may be implemented using a capacitor or a MOSFET. When programming an anti-fuse MOSFET, the process begins with application of voltage stress to the MOSFET gate, which causes defects to appear in the gate-oxide. As the defect density increases, eventually a critical level is reached where a current may flow through the oxide through a chain of defects. The thermal effects of the current solidifies this newly formed conductive channel, or "pinhole," through the oxide. For a capacitor anti-fuse, a programming voltage causes a breakdown in the capacitor dielectric and a resulting short across the capacitor electrodes in a similar manner as described above.

FIG. 1 shows a schematic of one proposal for anti-fuse cells arranged in an array 10 of a one-time programmable memory device 10. Each cell 20 contains an anti-fuse element 30, common gate transistor 40 connected to one node of anti-fuse element 30, and switch transistor 50 having a gate connected to a word line WL1 and one source/drain terminal connected to a bit line BL1 and another connected to transistor 40. A second node of the anti-fuse element 30 is connected to a programming voltage source line $V_{CMN}$.

During the readout, the anti-fuse element 30 is directly driving the entire column output line, shown as bit line BL1, which has a high load. In order to meet typical programming and readout speed requirements, a low resistance anti-fuse is required to drive the high column load, which in turn requires a large common gate transistor 40 and switch transistor 50 to deliver the current necessary to lower the resistance of the anti-fuse.

A method, apparatus and system providing an improved anti-fuse cell and array structure are desired which provide a smaller anti-fuse area, increased readout speed, and lower power requirements.

DETAILED DESCRIPTION OF THE INVENTION

Figure 1:
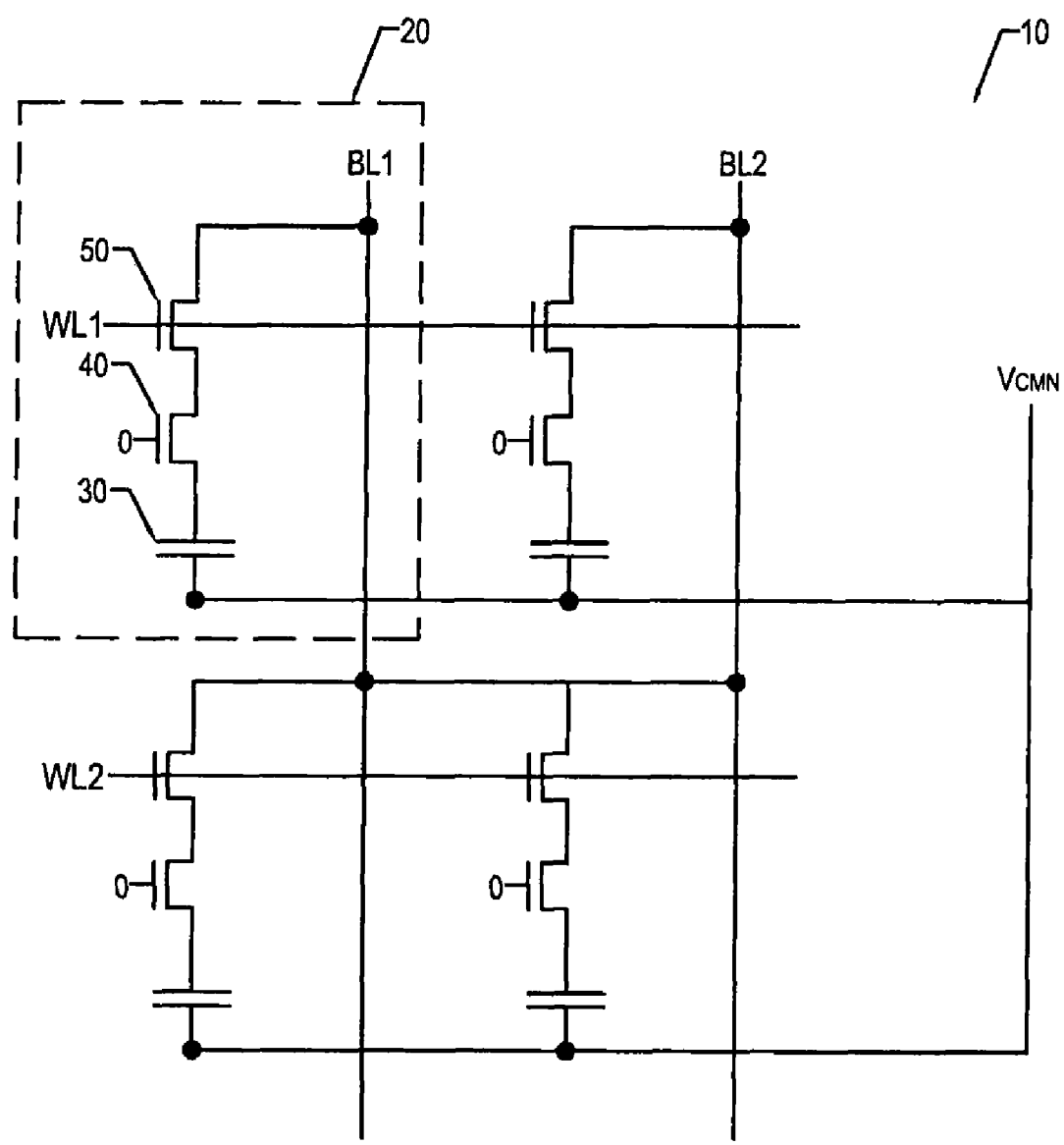
FIG. 1 is a schematic circuit diagram of a proposed anti-fuse memory cell array.

In the following detailed description, reference is made to the accompanying drawings, which form a part hereof and illustrate specific embodiments in which the invention may be practiced. In the drawings, like reference numerals describe substantially similar components throughout the several views. These embodiments are described in sufficient detail to enable those skilled in the art to practice the invention, and it is to be understood that other embodiments may be utilized, and that structural, logical and electrical changes may be made within the bounds covered by the disclosure.

Figure 2:
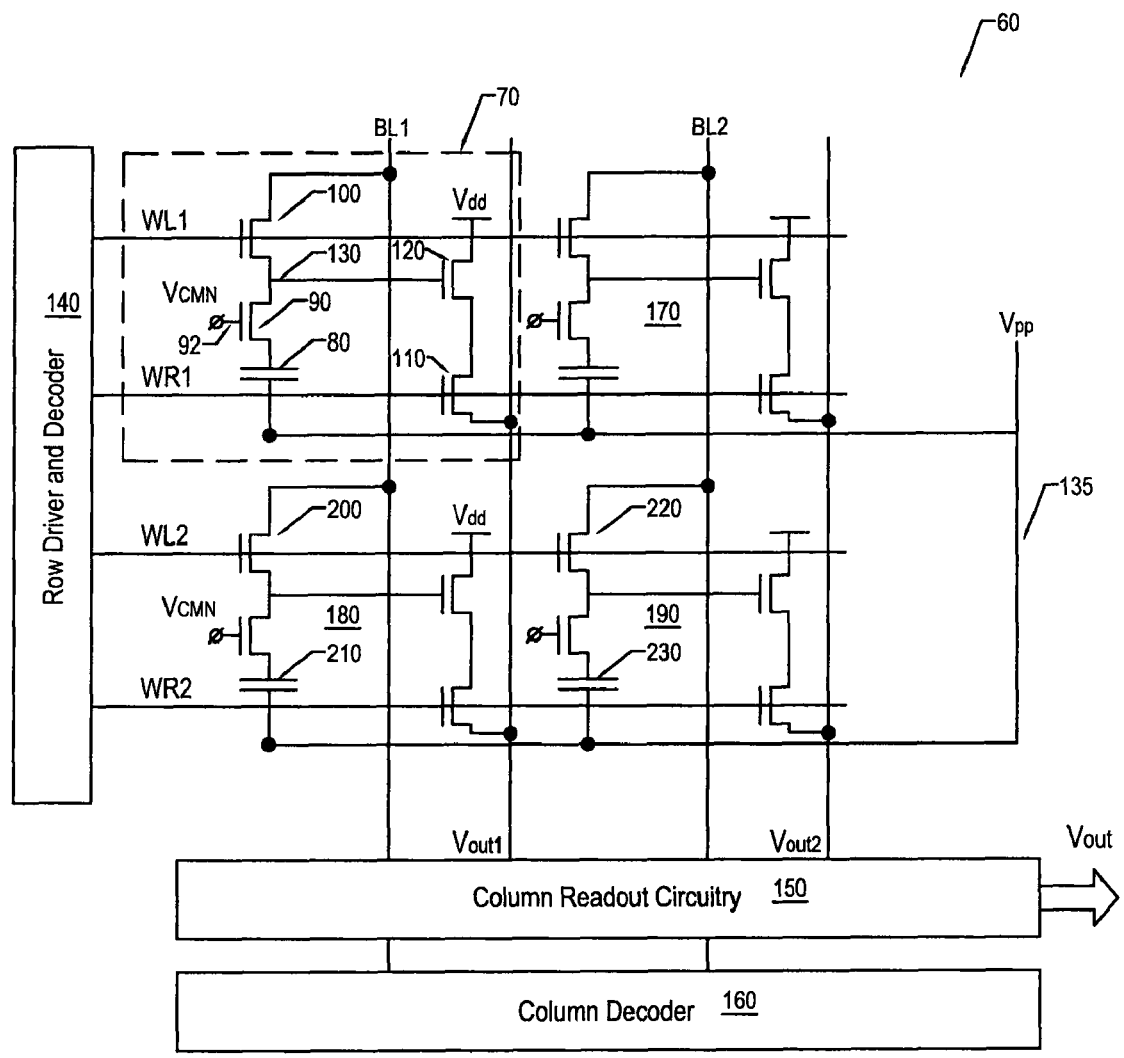
FIG. 2 is a schematic circuit diagram of an embodiment of an anti-fuse memory cell array.

Referring now to the drawings, FIG. 2 illustrates an embodiment of a one-time programmable memory device having an array 60 of anti-fuse memory cells 70. The array 60 of anti-fuse memory cells 70 ("anti-fuse cells") are accessible by row driver and decoder 140 and column decoder 160. The anti-fuse cell 70 includes an anti-fuse element 80, a common gate transistor 90, a switch transistor 100, a row-select transistor 110, an amplifier transistor 120, and a storage region 130, e.g., a floating diffusion region. The anti-fuse cell 70 is accessible for programming and readout via signals on bit line BL1, word line WL1, and word read line WR1. Word line WL1 and word read WR1 are connected to the row driver 140 output and are shared by an entire row of anti-fuse cells 70. Bit line BL1 is controlled by the column decoder 160 and is shared by an entire column of anti-fuse cells 70. The gates of common gate transistor 90 of all cells are commonly coupled to a voltage source line providing a common gate voltage $V_{CMN}$.

Vpp is a programming voltage applied to line 135 which is coupled to one or more of each of the anti-fuse elements 80. The voltage Vpp is high enough to program anti-fuse elements 80 when applied. Vdd is the anti-fuse cell 70 power supply voltage and is high enough such that when Vdd is applied to a bit line, e.g. BL1 through transistor 100 or 90 and to anti-fuse element 80, Vpp−Vdd results in a voltage potential insufficient to program anti-fuse element 80. FIG. 2 shows four anti-fuse cells 70, 170, 180 and 190 arranged in two rows and two columns, however it should be understood that the array could comprise hundreds or thousands of cells or more arranged in a plurality of rows and columns. Column readout circuitry 150 will be described further below.

Figure 3:
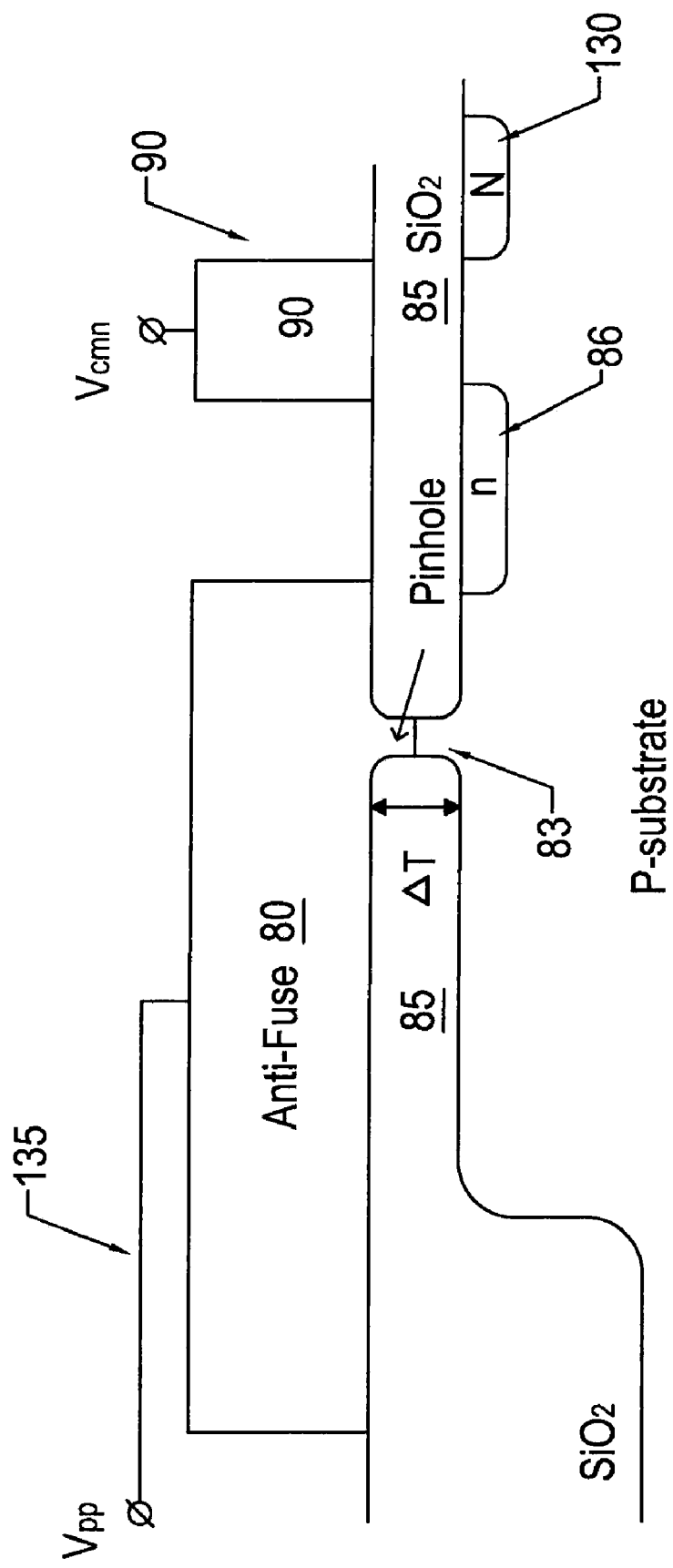
FIG. 3 is a semiconductor side view of an anti-fuse MOSFET and common gate transistor.

Anti-fuse element 80 could be implemented in a number of ways known in the art, for example, using a capacitor or a MOSFET. Not limited to the following example, anti-fuse element 80 is implemented using a MOSFET in one embodiment. FIG. 3 shows a semiconductor-level view of a MOSFET anti-fuse element 80 provided over a silicon dioxide layer 85, which is coupled to common gate transistor 90. The gate of anti-fuse element 80 is connected to Vpp and after anti-fuse element 80 is programmed, its source is created via a newly formed pinhole 83. When anti-fuse element 80 is un-programmed, there is no pinhole 83 or source and the device operates in the cut-off region. As noted, the anti-fuse element 80 may also be constructed as a capacitor structure.

Referring back to FIG. 2, anti-fuse element 80 is cascoded with common gate transistor 90 so that common gate transistor 90 may provide high voltage protection for other elements of the memory cell 70. The gate of common gate transistor 90 is consistently biased by DC voltage $V_{CMN}$ on a common line 92 which is commonly connected to the gates of all transistors 90 of cells 70 of the array 60. The drain of common gate transistor 90 is connected to anti-fuse element 80 and the source is connected to storage region 130 which may be formed in a substrate as a floating diffusion region. When anti-fuse element 80 is programmed, the resistance between Vpp and the drain of common gate transistor 90 is relatively low. Accordingly, when a high gate voltage $V_{CMN}$, for example Vpp/2, is applied on the gate of common gate transistor 90, the voltage seen by storage region 130, is equal to $V_{CMN}-V_T$, where $V_T$ is a threshold voltage of common gate transistor 90. As a result, other cell elements, i.e., switch transistor 100 and amplifier transistor 120, are protected from the high voltage stress required to program anti-fuse element 80.

Figure 4:
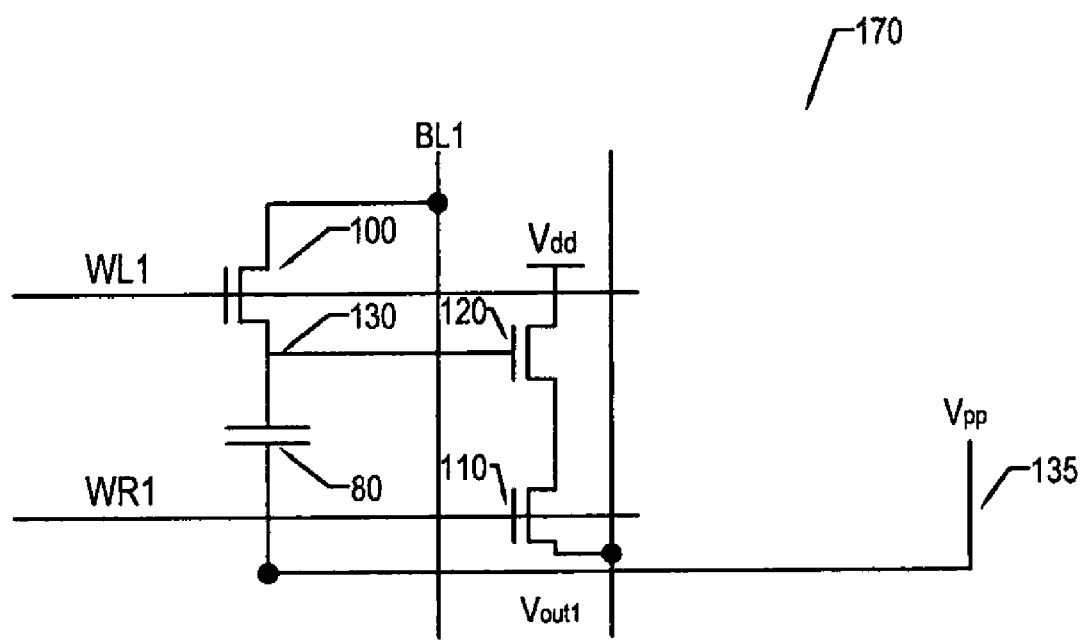
FIG. 4 is an embodiment of an three-transistor anti-fuse memory cell having an anti-fuse with a thinned gate oxide.

FIG. 4 shows a three transistor embodiment of an anti-fuse cell 170. The thickness T of gate oxide 85 shown in FIG. 3 may be decreased to lower the voltage Vpp required to program anti-fuse element 80. If gate oxide 85 thickness T is lowered enough to allow a low programming voltage Vpp of 5V or less, common gate transistor 90 is no longer needed and may be removed, resulting in a smaller cell 170.

Referring back to FIG. 2, anti-fuse cell 70 includes storage region 130 for storing charge in programmed cells. Storage region 130 is connected to a switch transistor 100, which is connected between storage region 130 and bit line BL1. Switch transistor 100 is controlled at its gate by a signal on word line WL1 to select a row which is accessed along with a selected column and associated bit line BL1 during memory cell 70 programming and readout.

Storage region 130 is also connected to the gate of an in-cell amplifier transistor 120 which provides an increased load driving capability to an output column line $V_{OUT1}$, $V_{OUT2}$, etc of a memory cell 70. The load of one readout column in the array (e.g., $V_{OUT1}$) is a mainly capacitive load which slows down the response to signal change. The time needed to charge up or discharge the column lines Vout1, Vout2, etc., can be described by:

$$T_{settle}=(C_{col\_load}*Vsig)/I_{col\_bus}$$

where $I_{col\_bus}$ is the column line current and $C_{col\_load}$ is the column line capacitive load. The column line capacitive load $C_{col\_load}$ usually comes from metal routing parasitic capacitance and the thousands of junctions connected to the Vout lines. As can be seen, the settle time $T_{settle}$ is inversely proportional to the column line's current $I_{col\_bus}$. Compared to anti-fuse memory cell 20 of FIG. 1, anti-fuse cell 70 provides an amplified signal which proportionally increases column current $I_{col\_bus}$. An increased column line current allows a faster settle time $T_{settle}$ and accordingly faster readout speed.

Memory cell 70 also includes a row-select transistor 110, which couples amplifying transistor 120 to a column line, e.g., Vout1. Row select transistor 110 has a gate controlled by a signal on word read line WR1.

A selected cell of the array, e.g. memory cell 70, is programmed by properly setting the voltage at BL1 and WL1 to program only memory cell 70, while leaving all unselected memory cells un-programmed. Table 1 shows a programming truth table for voltages on all BL, WL and WR lines in array 60 to program a selected memory cell 70.

TABLE 1

| State | $V_{BL}$ | $V_{WL}$ | $V_{WR}$ |
|---|---|---|---|
| SC/SR | 0 | Vdd | 0 |
| SC/UR | 0 | 0 | 0 |
| UC/SR | Vdd | Vdd | 0 |
| UC/UR | Vdd | 0 | 0 |

Key:
SC = Selected Column
UC = Unselected Column
SR = Selected Row
UR = Unselected Row
$V_{BL}$ = Bit Line Voltage
$V_{WL}$ = Word Line Voltage
$V_{WR}$ = Word Read Voltage Referring to the cells in FIG. 2 array 60 by an (X,Y) addressing scheme where cell 70 is (1,1), according to TABLE 1, cell 70, as the selected cell, is in state SC/SR. To select only cell 70 for programming, bit line col 1 ("BL(1)") is set to 0, word line row 1 ("WL(1)") is set to Vdd, and word read row 1 ("WR(1)") is set to 0. Under these conditions the voltage across anti-fuse element 80 is close to: Vpp−0. Therefore, anti-fuse element 80 is biased at close to the full programming voltage Vpp and will be programmed. The surrounding cells, however, remain unaffected. The cell 170 in position (1,2) will receive signals according to TABLE 1 corresponding to state UC/SR (selected row, unselected column). Accordingly, the voltages applied to cell 170 are BL(2) set to Vdd, WL(1) set to Vdd, and WR(1) set to 0. Under these conditions the voltage across the anti-fuse element 175 of memory cell 170 is: Vpp−Vdd. The difference results in a voltage insufficient for programming anti-fuse element 175, and memory cell 170 remains un-programmed. The memory cell 180 in position (2,1) will receive signals according to TABLE 1 corresponding to state SC/UR. The voltages applied to the cell are BL(1) set to 0, WL(2) set to 0, and WR(2) set to 0. Under these conditions the switch transistor 200 is turned off and one end of anti-fuse element 210 is floating. The voltage across anti-fuse element 210 will be close to 0, accordingly it will not be programmed. The memory cell 190 in position (2,2) will also receive WL(2) set to 0, resulting in switch transistor 220 being turned off as well, with similar results to memory cell 180. All other memory cells in array 60 would receive signals corresponding to those from one of the three possible states of unselected cells and will therefore remain un-programmed.

Figure 5:
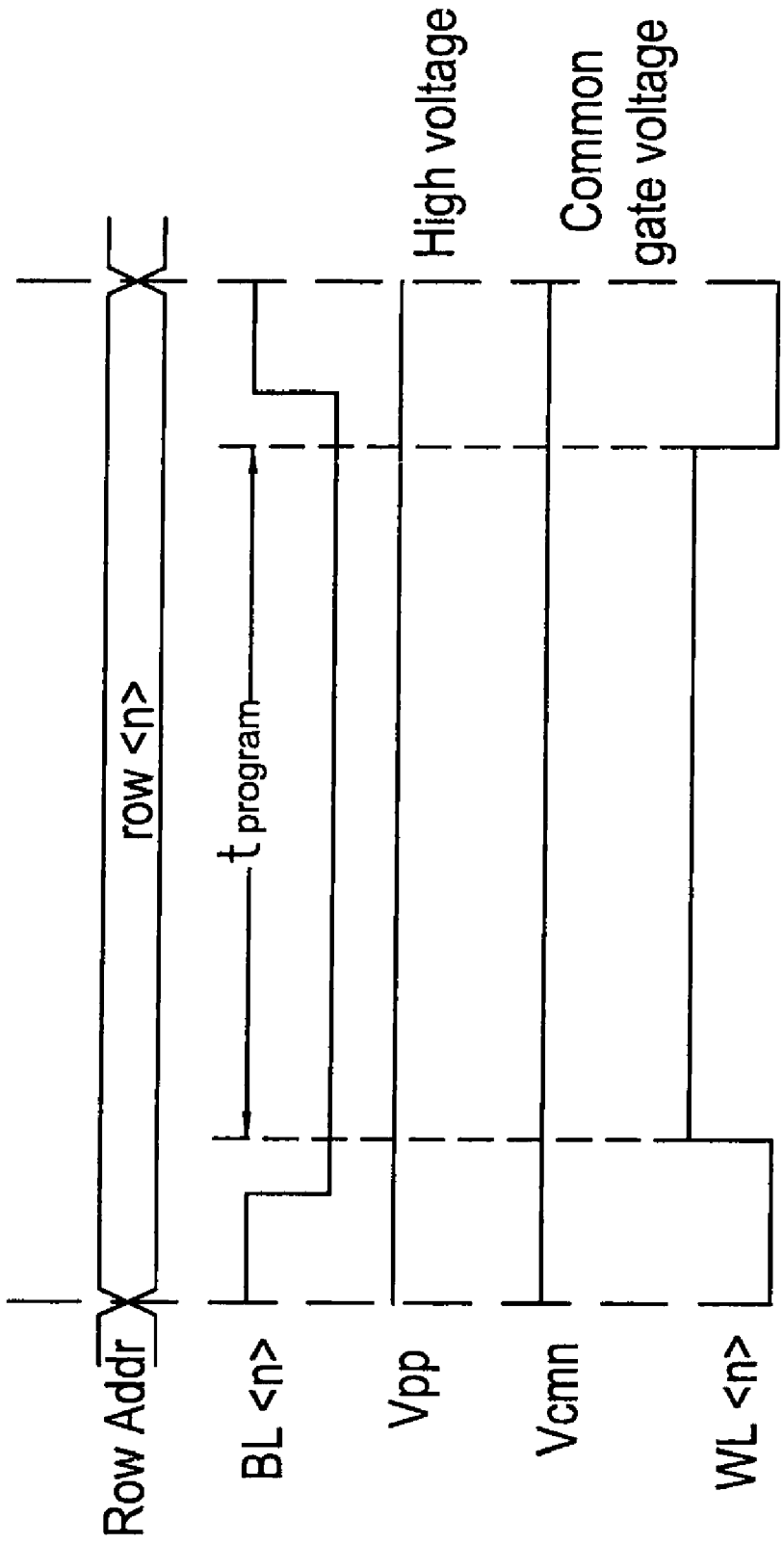
FIG. 5 is a timing diagram for programming the embodiments of FIG. 2.

FIG. 5 shows a timing diagram of a programming sequence for a selected memory cell, e.g., memory cell 70. The common gate voltage $V_{CMN}$ is applied transistor 90. The bit line BL voltage then drops low, e.g., to ground. Next, the word line WL is pulsed high and remains high for a time $t_{program}$ sufficient to allow the voltage Vpp to program the anti-fuse element 80 in the selected cell. The anti-fuse element 80 is programmed and word line WL returns low. The bit line BL then returns high.

Figure 2A:
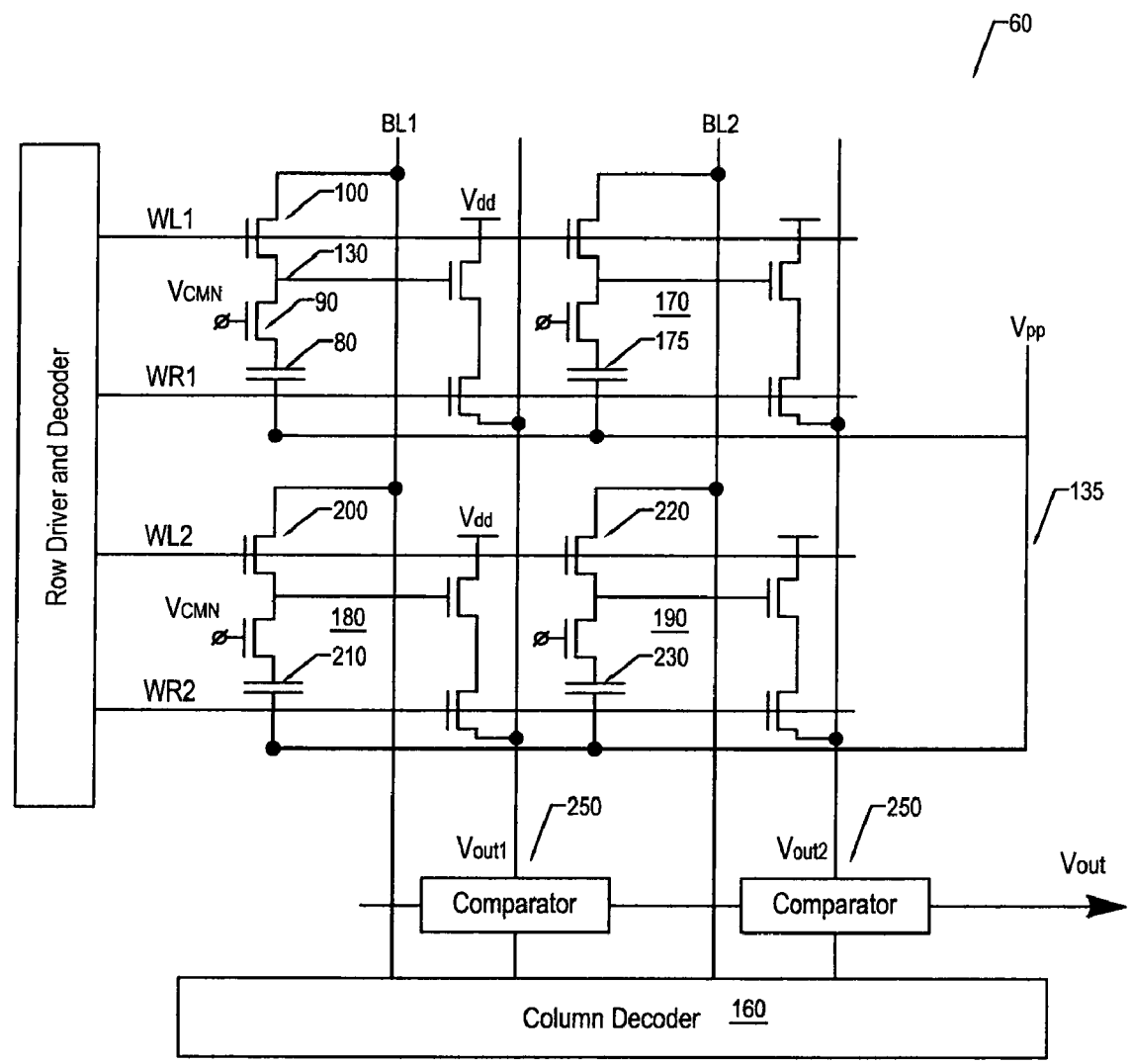
FIG. 2A is a schematic circuit diagram of an embodiment of an anti-fuse memory array including a comparator for a readout circuit.
Figure 2B:
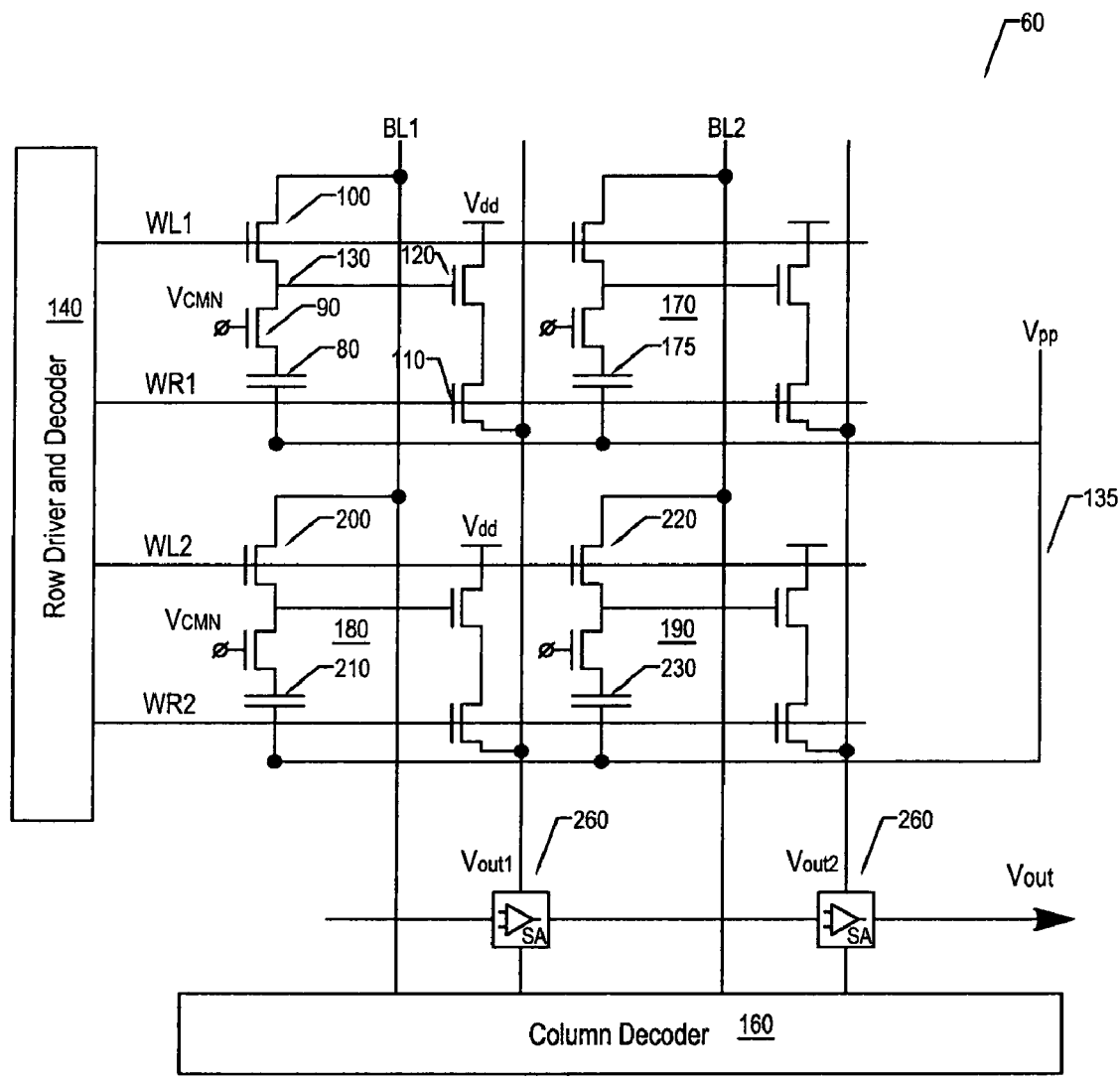
FIG. 2B is a schematic circuit diagram of an embodiment of an anti-fuse memory array including a sense amplifier for a readout circuit.

Referring again to FIG. 2, array 60 includes column readout circuitry 150 for reading data out of array 60. Data read out for a row of anti-fuse cells 70 in an array occurs when a signal on word read line WR1 goes high and turns on transistor 110, and signal $V_{CMN}$ is high enough, preferably approximately Vpp/2, to at least partially turn on transistor 90. The state of the signal on storage region 130 with transistors 100 and 90 on will depend on whether anti-fuse element 80 is programmed or not. If anti-fuse element 80 is programmed, a relatively high level of charge appears on storage region 130 such that a high signal level is provided by transistor 120. If anti-fuse element 80 is not programmed, storage region 130 has a relatively low level of charge and a relatively low signal is provided by transistor 120. Various types of readout circuitry used in array based memory devices may be employed. In one embodiment, readout circuitry 150 comprises a comparator (shown in FIG. 2A) at each column line, e.g. $V_{OUT1}$, to digitize the output signal directly. In another embodiment, readout circuitry 150 comprises a sense amplifier 260 (shown in FIG. 2B) each column line which is sensitive to signal change. A sense amplifier 260 may be used to resolve differences in signal output and to quickly toggle the output in applications in which high readout speed is critical. Alternatively, a readout amplifier 265 may be used on the column lines to amplify the output signal and improve readout accuracy (shown in FIG. 2D). In another embodiment, readout circuitry 150 comprises correlated double sampling circuitry, including a sample and hold circuit 270, differential amplifier 280 and analog to digital converter 290, as is known in the art of CMOS pixel array readout (shown in FIG. 2C).

Figure 2C:
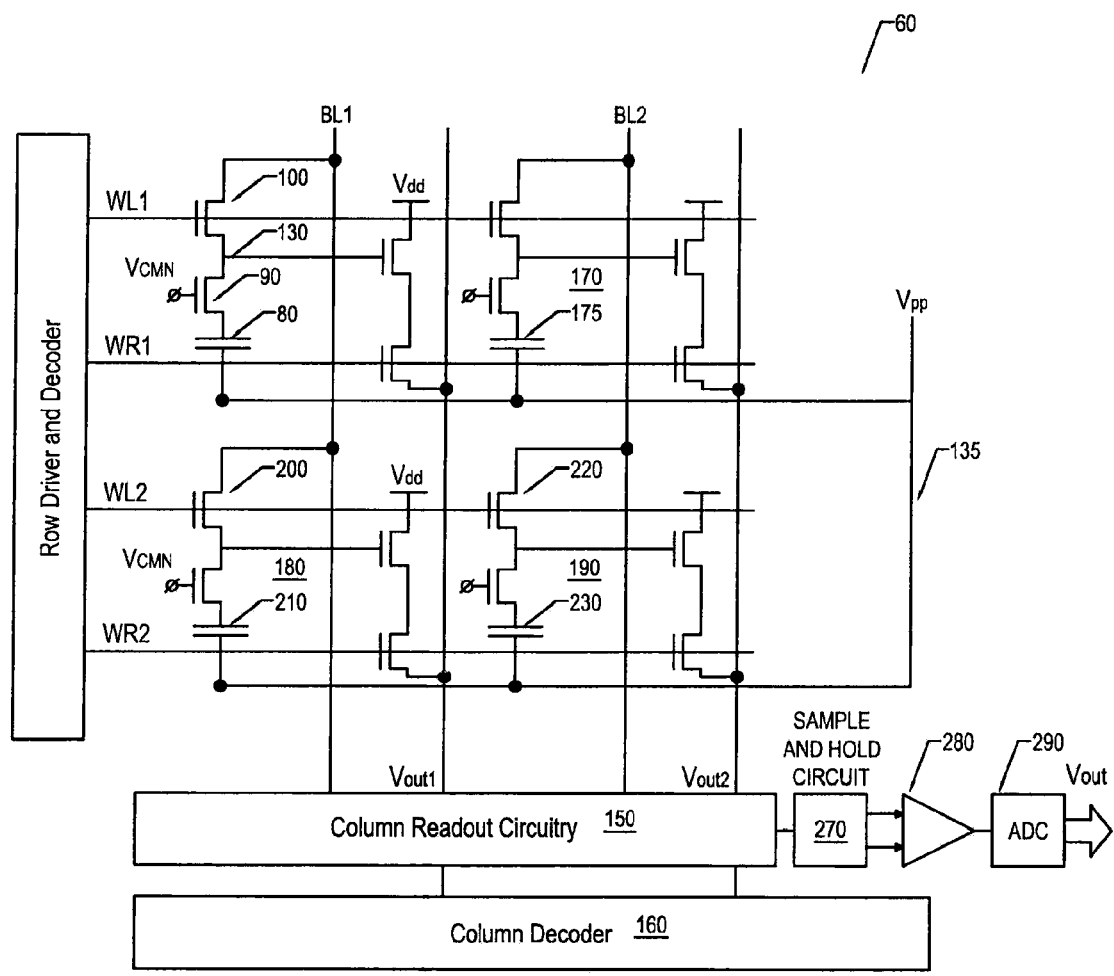
FIG. 2C is a schematic circuit diagram of an embodiment of an anti-fuse memory array including readout circuitry for correlated double sampling.
Figure 2D:
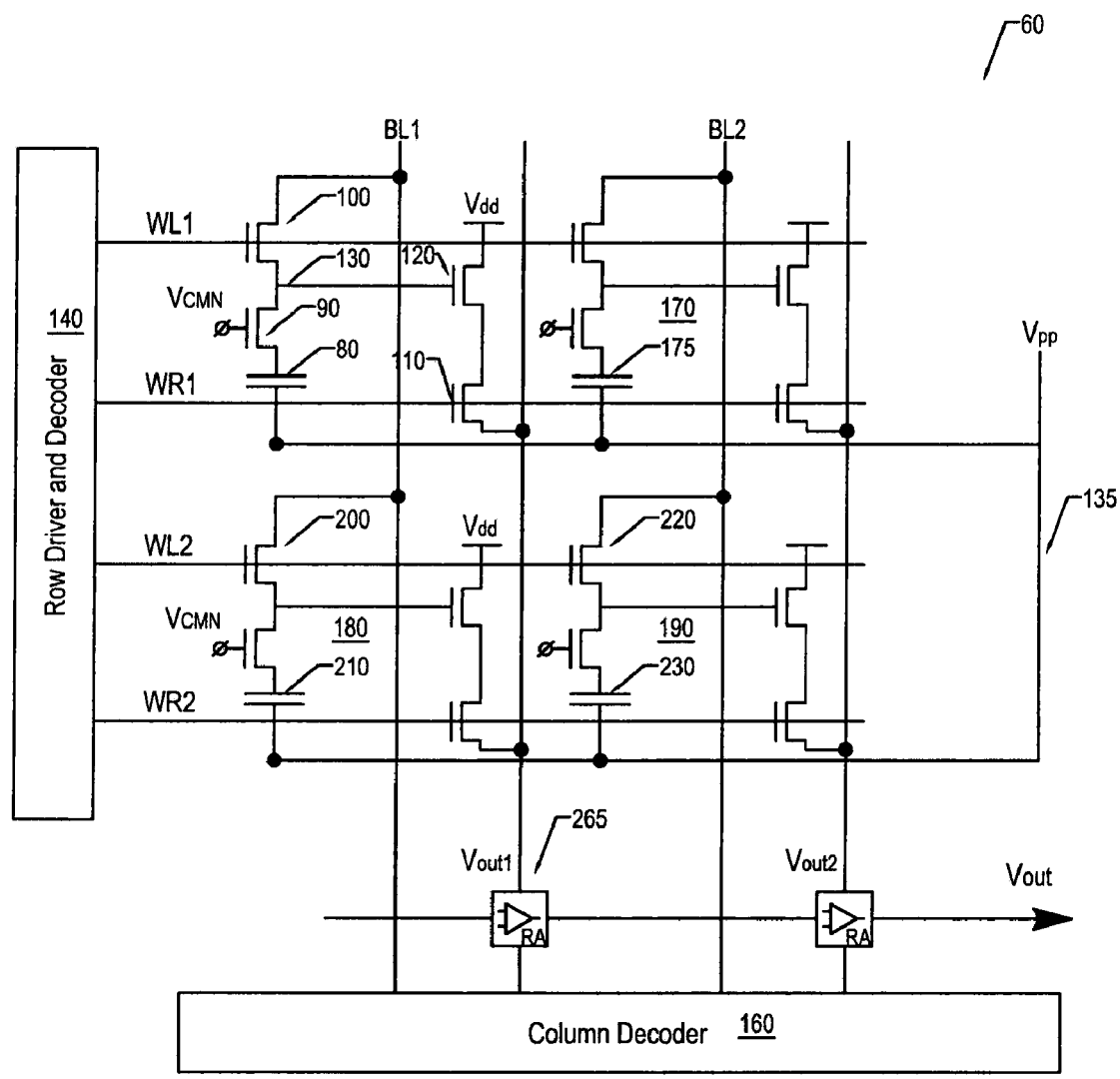
FIG. 2D is a schematic circuit diagram of an embodiment of an anti-fuse memory array including a readout amplifier for a readout circuit.
Figure 6:
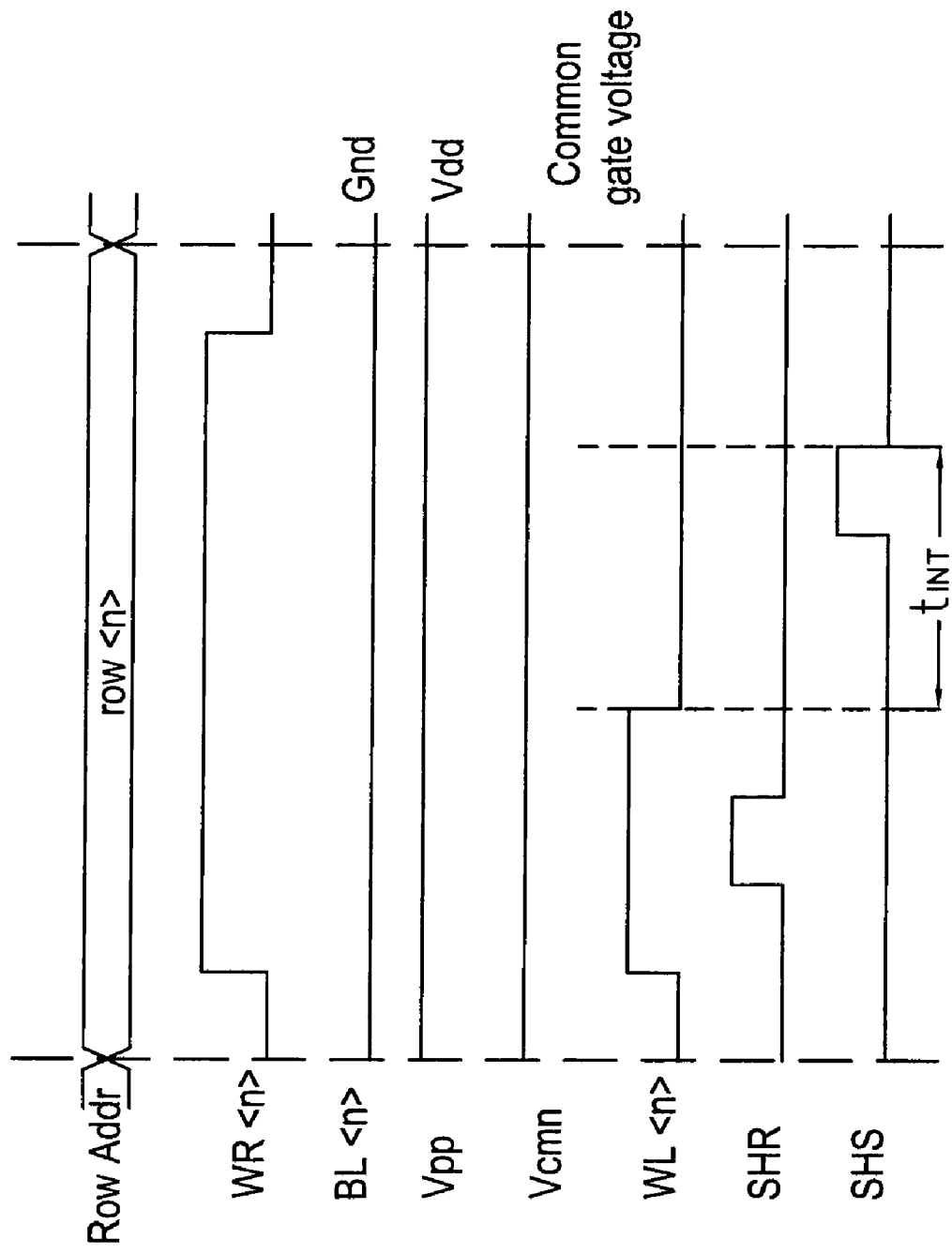
FIG. 6 is a timing diagram for readout of the embodiment of FIG. 2C.

FIG. 6 shows a timing diagram of a readout sequence for a selected memory cell 70 of a selected row of memory cells using a correlated double sampling readout circuitry depicted in FIG. 2C. First, word read signal WR1 goes high to turn on row select transistor 110. Then word line signal WL1 is pulsed high, resetting storage region 130 to a ground level while bit line BL1 is held at ground potential. A sample and hold reset SHR signal is pulsed to readout storage region 130 reset voltage on column lines Vout1 into a first capacitor of sample and hold circuit 270. Word line signal WL1 then drops low, initiating integration of the storage region 130 in all cells having a programmed anti-fuse element 80. During integration time $t_{INT}$, storage region 130 in cells having a programmed anti-fuse element 80 will have a charge corresponding to a high voltage, Vdd on signal line Vpp. At the end of $t_{INT}$, a sample and hold signal SHS is pulsed to sample the memory cell 70 output signal voltage onto column line Vout1 and into a second capacitor of sample and hold circuit 270. The SHR memory cell output values are subtracted from the SHS memory cell output value in differential amplifier 280 to cancel out common noise to improve the noise margin. The output signal of programmed cells will be near Vdd. For un-programmed cells, the resultant output signal is near ground potential. The respective resultant output signals may then be digitized by an analog to digital converter (ADC) 290 to provide output signals representing the programmed state of the memory cells of the selected row.

The FIG. 2C embodiment may be useful to integrate along with pixel cells of a CMOS imager array, where the readout circuit, including sample and hold circuit 270, differential amplifier 280, and ADC 290, can be shared with the readout circuit used for pixel array signal readout.

Figure 7:
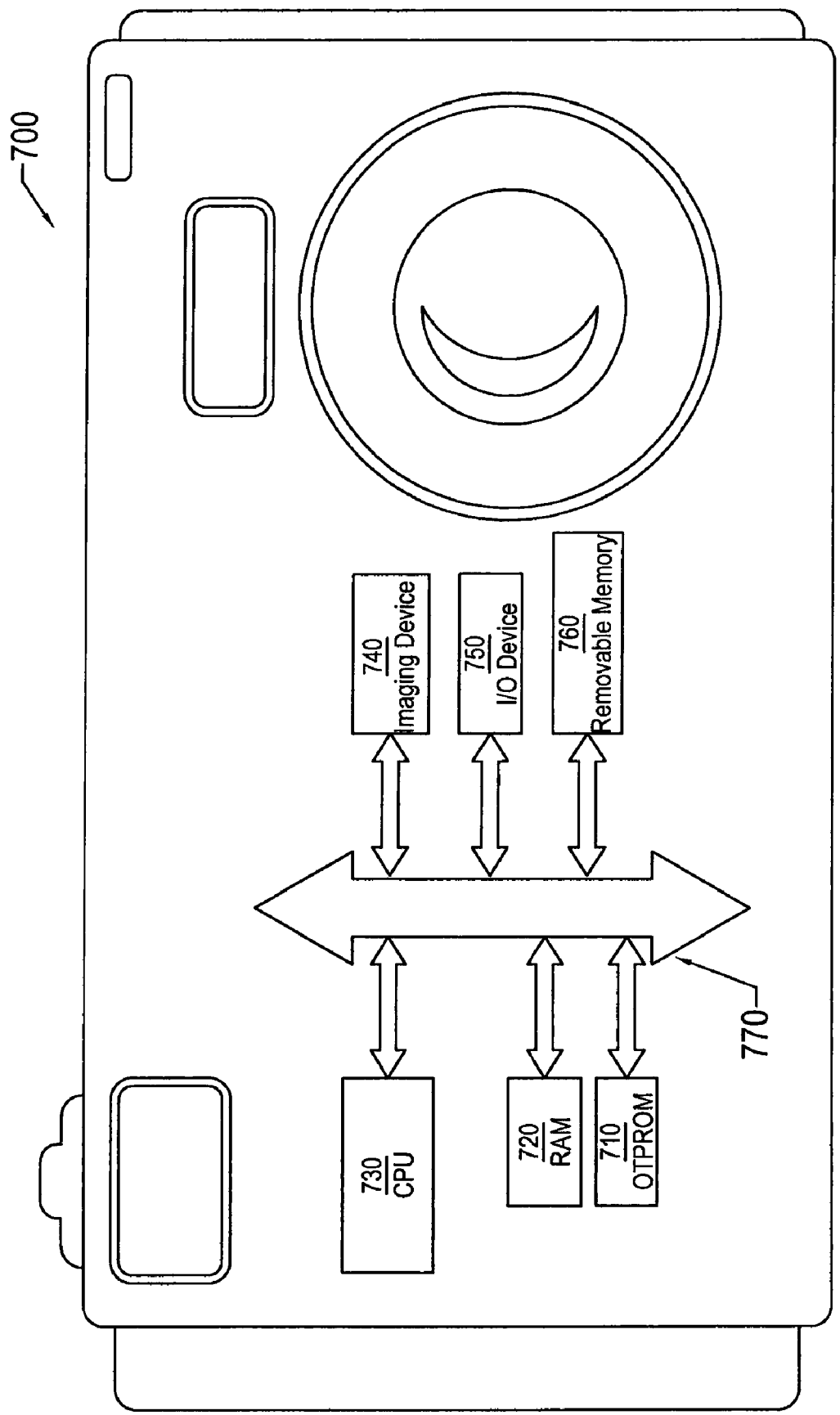
FIG. 7 is a block diagram of a processor system, e.g. a digital camera, incorporating an embodiment of an anti-fuse memory cell memory device.

FIG. 7 is a block diagram of a processing system, for example, a camera system 700 utilizing a one-time programmable memory device 710 constructed in accordance with an embodiment of the present invention. Although illustrated as a camera system the system 700 may also be a computer system, a process control system, or any other system employing a processor and associated one-time programmable memory. The system 700 includes a central processing unit (CPU) 720, e.g., a microprocessor, that communicates with the memory device 710 and one or more I/O devices 750 over a bus 770. It must be noted that the bus 770 may be a series of buses and bridges commonly used in a processor system, but for convenience purposes only, the bus 770 has been illustrated as a single bus. The processor system 700 may also include random access memory (RAM) device 720, an imaging device 740, and some form of removable memory 760, such a flash memory card, or other removable memory as is well known in the art.

It is again noted that the above description and drawings illustrate embodiments of the present invention. It is not intended that the present invention be limited to the illustrated embodiments. Modifications can be made to the embodiments. Accordingly, the invention is not limited by the foregoing description or drawings, but is only limited by the appended claims.

What is claimed as new and desired to be protected by the Letters Patent of the United States is:

1. A method of reading memory cells containing an anti-fuse element, the memory cells being arranged in a cell array, the method comprising:
    selecting a row of memory cells for readout;
    charging a storage region of all programmed memory cells in the row in accordance with a programmed state of an anti-fuse element within each memory cell by activating a common gate transistor between each anti-fuse element and storage region; and
    reading out output signals associated with the level of charge stored in the storage region of all memory cells in the row.

2. The method of claim 1, wherein the reading out of the output signals comprises, for each cell:
    sampling a signal representing a reset value of the storage region;
    sampling a signal representing a value of the storage region set by the state of the anti-fuse element; and
    outputting an output signal equal to the difference between the sampled signal value signal and the reset value signal.

3. The method of claim 1, wherein the output signals are digitized by respective comparators.

4. The method of claim 1, wherein the output signals are read out by respective sense amplifiers.

5. A memory device, comprising:
    a plurality of memory cells arranged in an array of rows and columns, at least one of the memory cells comprising:
        a one-time programmable anti-fuse element;

a storage region for storing a charge related to the programmed state of the anti-fuse element, and an amplifier transistor having a gate connected to the storage region for amplifying a signal from the storage region and providing the amplified signal as an output signal;

a plurality of pixel cells arranged in an array of rows and column and integrated with the memory cell array; and a common readout circuit operable to read output signals from the memory cell and pixel cell arrays.

6. The memory device of claim 5 wherein the one-time programmable anti-fuse element comprises a MOSFET transistor.

7. The memory device of claim 5 wherein the anti-fuse element comprises a capacitor.

8. The memory device of claim 5, wherein the common readout circuit comprises:

circuitry for reading out the at least one memory cell as a reset state of the storage region and as a signal state of the storage region which is determined by the state of the one-time programmable anti-fuse element.

9. The memory device of claim 5, wherein the readout circuit further comprises sample and hold circuitry for storing a reset state and signal state of a memory cell or pixel cell, and a differential amplifier for subtracting the signals stored in the sample and hold circuitry.

10. The memory device of claim 5, wherein the readout circuit comprises a sense amplifier.

11. The memory device of claim 5, wherein the readout circuit comprises a comparator.

12. The memory device of claim 5, wherein the readout circuit comprises a readout amplifier.

13. The memory device of claim 5, wherein the memory cell and pixel cell arrays share common row and column lines.

* * * * *